United States Patent [19]

Chinone et al.

[11] Patent Number: 4,506,366
[45] Date of Patent: Mar. 19, 1985

[54] SEMICONDUCTOR LASER DEVICE

[75] Inventors: Naoki Chinone, Hachioji; Yasutoshi Kashiwada, Hinodemachi; Shigeo Yamashita, Machida; Kunio Aiki, Takasaki, all of Japan

[73] Assignee: Hitachi, Ltd., Tokyo, Japan

[21] Appl. No.: 393,313

[22] Filed: Jun. 29, 1982

[30] Foreign Application Priority Data

Jul. 3, 1981 [JP] Japan ................................. 56-103344

[51] Int. Cl.$^3$ ............................................. H01S 3/19
[52] U.S. Cl. ........................................ 372/45; 357/17; 372/46
[58] Field of Search ............... 372/45, 46, 48; 357/17

[56] References Cited

U.S. PATENT DOCUMENTS 4,185,256 1/1980 Scifres et al. ........................ 372/45

OTHER PUBLICATIONS

Patents Abstracts of Japan; vol. 3, No. 48, 4/24/79, pp. 13 & 106 & JP-A-5425685 (Nippon Denki K.K.)(26-2-79).
Patents Abstracts of Japan; vol. 3, No. 107, 9/8/79, pp. 136 & 136 & JP-A-54-85-688 (Nippon Denki K.K.)(7-7-79) (Cat. D).

Primary Examiner—James W. Davie
Attorney, Agent, or Firm—Kenyon & Kenyon

[57] ABSTRACT

A semiconductor laser device including at least a laminated region of first, second, third and fourth semiconductor layers on a predetermined semiconductor substrate, wherein the third semiconductor layer has a refractive index smaller than that of the second semiconductor layer; the first and fourth semiconductor layers have a refractive index smaller than that of the second and third semiconductor layers and have a conductivity type opposite that of the second and third semiconductor layers; the forbidden band gap of the first and third semiconductor layers is greater than that of the second semiconductor layer; and at least the second and third semiconductor layers are bent so that the laser light generated inside the second semiconductor layer in the proximity of the laser light-emitting facets generates optical coupling in the third semiconductor layer and is emitted from the crystal facets of the third semiconductor layer. The device of the present invention is effective for increasing the output of semiconductor laser devices.

7 Claims, 11 Drawing Figures

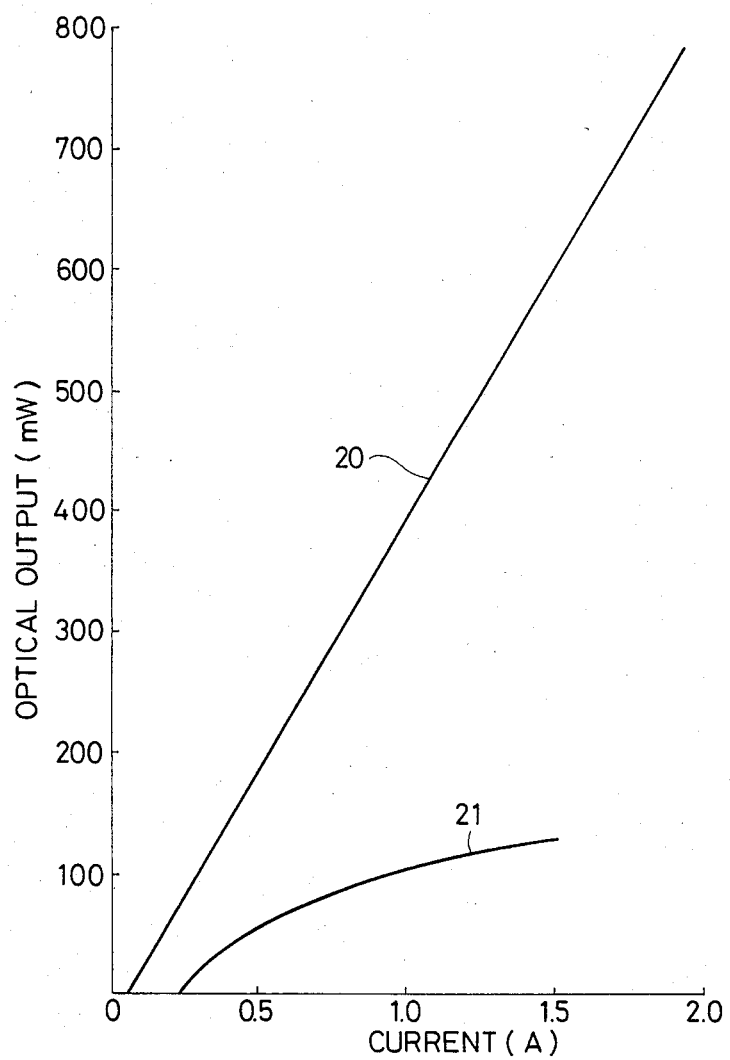

SEMICONDUCTOR LASER DEVICE

BACKGROUND OF THE INVENTION

1. Field of the Invention

This invention relates to an improved semiconductor laser device which prevents catastrophic degradation of the facets by the optical output and provides a high optical output.

2. Description of the Prior Art

What determines the upper limit of the optical output of a semiconductor laser device is catastrophic degradation of facets. The degradation gradually proceeds even when the laser device is operated at a low output and essentially determines the service life of the device. To prevent the catastrophic degradation of facets, the facets have conventionally been coated with an insulating film, but the degradation is likely to proceed from the interface between the insulting film and the semiconductor surface.

Thus it is preferred that the surface be coated with a semiconductor film which continues in a crystal arrangement the semiconductor forming the laser device. A method of accomplishing this object has been conceived in which, referring to FIG. 1, gutters 12 and 12' are provided on a substrate 1 in the proximity of facets 8, 9 and an active layer 3 is suspended so that the laser light comes out of the device in the proximity of the facets and is reflected by a transparent portion 4. The drawing is a sectional view in the plane parallel to the propagating direction of the laser light. Semiconductor layers 2 and 4 form clad layers while a semiconductor layer 5 forms a cap layer. Reference numerals 6 and 7 represent electrodes. However, it has been found in this method that the reflected light does not always return to the original active region, increasing the optical losses.

A semiconductor device as shown in FIG. 1 is disclosed in Japanese Patent Publication No. 54-85688 (1979), for example.

SUMMARY OF THE INVENTION

In order to eliminate the abovementioned problems with the prior art, the present invention provides a semiconductor laser device which is transparent in the proximity of the facets and has sufficiently small optical losses. The characterizing feature of the present invention resides in that recesses (or protuberances) are defined on a substrate in the proximity of the crystal facets and a multi-layered structure including an active layer and an optical guiding layer grown on the recesses (or the protuberances).

In other words, the semiconductor laser device of the present invention includes at least a laminate layer region of first, second, third and fourth semiconductor layers on a predetermined semiconductor substrate, wherein the third semiconductor layer has a refractive index smaller than that of the second semiconductor layer; the first and fourth semiconductor layers have a refractive index smaller than that of the second and third semiconductor layers and have a conductivity type opposite that of the second and third semiconductor layers; the forbidden band gap of the first and third semiconductor layers is greater than that of the second semiconductor layer; and at least the second and third semiconductor layers are bent so that the laser light generated inside the second semiconductor layer in the proximity of the laser light-emitting facets generates optical coupling in the third semiconductor layer and is emitted from the crystal facets of the third semiconductor layer.

As described above, the recesses or protuberances are formed on the semiconductor substrate in the proximity of the crystal facets so that the laser light generated inside the second semiconductor layer in the proximity of the laser light-emitting facets generates optical coupling in the third semiconductor layer, and an active layer as well as an optical guiding layer formed thereon are bent in order to accomplish the object of the invention.

BRIEF DESCRIPTION OF THE DRAWINGS

FIG. 11 is a diagram showing the relation between the current and optical output of the semiconductor laser device in accordance with an embodiment of the present invention in comparison with that of a prior art device.

DESCRIPTION OF THE PREFERRED EMBODIMENTS

Figure 2:
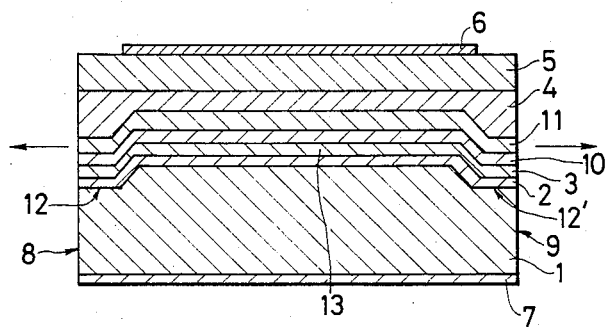
FIGS. 2, 7, 8, 9 and 10 are sectional views of semiconductor laser devices in accordance with embodiments of the present invention taken in a plane parallel to the propagating direction of the laser light.

FIG. 2 is a sectional view showing the basic structure of an embodiment of the present invention. The drawing is a sectional view in a plane parallel to the propagating direction of the laser light. A groove 12 is engraved on an n-GaAs substrate 1. An n-Ga$_{1-x}$Al$_x$As layer 2, a Ga$_{1-y}$Al$_y$As active layer 3 (Y<X), a p-Ga$_{1-w}$Al$_w$As blocking layer 10 (y<w), a p-Ga$_{1-z}$Al$_z$As optical guiding layer 11 (y<z<w), a p-Ga$_{1-z}$Al$_z$As layer 4 (z<x) and a p-GaAs layer (cap layer) 5 are formed on the n-GaAs substrate 1 thus prepared. The n-GaAlAs layer 2 and the p-GaAlAs layer 4 are a clad layer forming an ordinary double-hetero structure. Though not always necessary, the blocking layer is useful for carrier confinement. Next, a Cr-Au electrode 6 is formed except the portion close to the facets of the p-conductivity type surface while an AuGeNi-Au electrode 7 is formed on an n-conductivity type surface. The facets 8 and 9 are then formed by cleavage.

Figure 3:
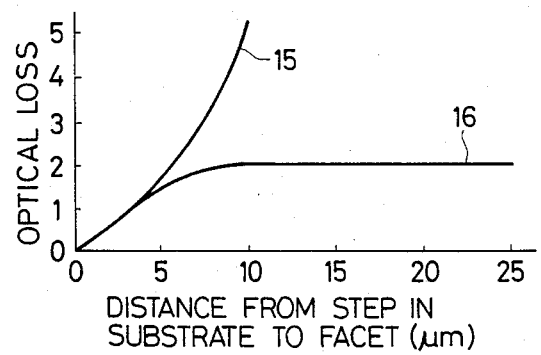
FIG. 3 is a diagram comparing the losses of a semiconductor laser device using the optical guiding layer and a device not using the same.

The operation of this device will now be described. When a current exceeding a threshold value is applied, laser oscillation occurs. In the semiconductor device having the structure shown in FIG. 1, however, the laser light leaks to the p-Ga$_{1-x}$Al$_x$As layer 4 at the position where the active layer 3 is curved and is reflected by the facets 8, 9 and a part of the reflected laser light returns to the active layer. The proportion of the laser light that returns to the active layer decreases proportionally to the distance from the curved portion of the active layer to the facets. Especially when the distance is about ~10 μm, the loss increases remarkably as shown by curve 15 in FIG. 3, the threshold value drastically increases and hence, the emission efficiency drops. Though FIG. 3 shows the case in which the active layer is 0.1 μm thick, this tendency does not change even if the thickness is reduced. This means that the cleavage of the element must be finely controlled in the proximity of the bent portion of the active layer. However, this control is extremely difficult in practical fabrication of the device.

On the other hand, in the semiconductor laser device in accordance with the present invention having the structure shown in FIG. 2, light leaking from the active region 3 at the curved portion of the active layer reaches the optical guiding layer 11 through the blocking layer 10, propagates inside the optical guiding layer and reaches the facets 8, 9, where it is reflected and returns to the active layer from the optical guiding layer. The optical coupling efficiency of the propagation of light from the active layer to the optical guiding layer and vice versa is not 100% and some optical loss does exist, but when the distance from the bent portion of the active layer to the facets exceeds a certain value the loss becomes contant and the rise of the threshold value as well as lowering of the differential quantum efficiency can be reduced and kept constant wherever the cleavage may be disposed, as is shown by curve 16 in FIG. 3. In order to make the portions close the facets transparent, it is of course necessary to have the AlAs mole fraction Z of the optical guiding layer greater than the AlAs mole fraction y of the active layer, when the GaAlAs type semiconductor material is used.

The depth of the gutter to obtain the abovementioned effect is associated with the thickness of each of the blocking layer 10 and the optical layer 11. To obtain the effect, the thickness is preferably at least 1 μm, and most preferably 2 to 4 μm.

Figure 4A:
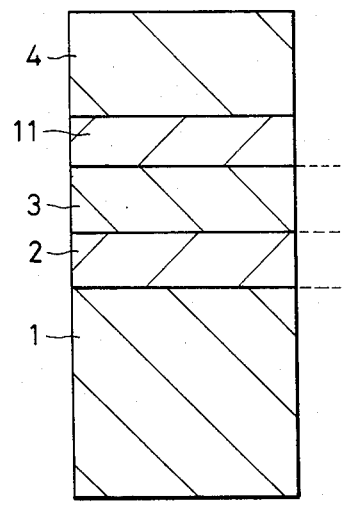
FIGS. 4 and 5 show the distribution of refractive indices of the semiconductor laser device in the optical confinement region.
Figure 4B:
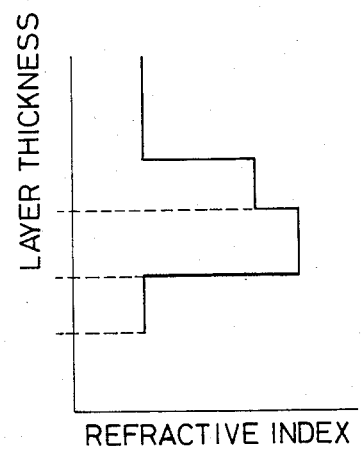

The distribution of the refractive indices of the basic laminate structure of the semiconductor layers is shown in FIG. 4. This drawing shows the case in which the groove is formed on the optical output facet. At least a first clad layer 2, an active layer 3, an optical guiding layer 11 and a second clad layer 4 are laminated on a semiconductor substrate 1. The first and second clad layers generally have opposite conductivity types. The semiconductor substrate 1 sometimes may consist of a plurality of semiconductor layers. A semiconductor layer such as a semiconductor layer 5 is further disposed on the second clad layer 4 from time to time. However, the basic structure for the laser oscillation is such as described above. Accordingly, layers other than the basic layers are deleted from the drawing.

As shown in FIG. 4, the refractive index $n_3$ of the active layer 3 and the refractive indices $n_1$ and $n_4$ of the clad layers 1 and 4 have the relation $n_3 > n_1$, $n_4$ and form the conventional doublehetero structure. On the other hand, the optical guiding layer 11 is formed so that its refractive index $n_{11}$ satisfies the relation $n_3 > n_{11} > n_1$, $n_4$. When the relation of the refractive indices is satisfied, the laser light is distributed in the active layer and in the optical guiding layer, making it possible to increase the optical output. On the other hand, carrier confinement inside the active layer can be sufficiently accomplished by selecting the forbidden band gaps of the active layer 3 $E_{g3}$, clad layer 4 $E_{g1}$ adjacent the active layer 3 and optical guiding layer 11 $E_{g2}$ to satisfy the relation $E_{g3} < E_{g1}, E_{g2}$.

It is also preferred to dispose semiconductor layers having a smaller refractive index and a greater forbidden band gap than those of the active layer on both sides of the side surface of at least the active layer perpendicular to the propagating direction of the laser light, as a buried layer. It is further preferred that the buried layer have a refractive index smaller than that of the optical guiding layer but a greater forbidden band gap. This structure is useful for controlling the mode in the direction parallel to the active layer (transverse mode). It is generally advantageous to bury the abovementioned laminate structure on the substrate as a whole. Needless to say, the object of the present invention can be accomplished without using such a buried layer. Various means for controlling the transverse mode of the laser have been proposed and they can be of course used conjointly with the present invention.

Figure 5A:
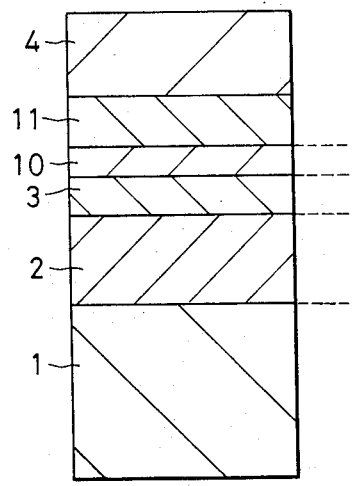
Figure 5B:
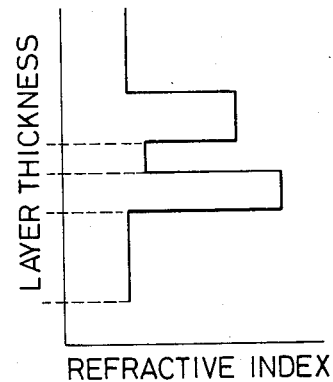
Figure 6:
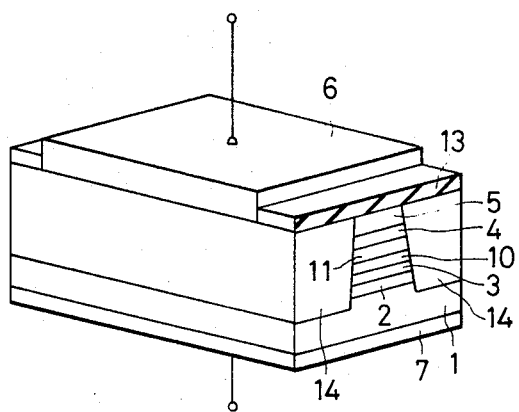
FIG. 6 is a perspective view showing another embodiment of the present invention.

A mechanism of confining the laser light and the carrier may have a five-layered laminate structure. FIG. 5 shows the distribution of its refractive indices. This structure is an improvement on the four-layered laminate structure described above. A semiconductor layer 10 is introduced between the active layer 3 and the optical guiding layer 11 as a carrier confinement layer. The other regions represented by reference numerals are the same as those shown in FIG. 4. The refractive index $n_{10}$ of the carrier confinement layer 10 is selected so as to satisfy the relation $n_3 > n_{11} > n_{10}$ so that the forbidden band gap is greater than that of the optical guiding layer 11. The advantage of this structure is that the optical distribution width can be enlarged by increasing the refractive index of the optical guiding layer 11 for confining the light.

The carrier confinement layer 10 having a large forbidden band gap prevents the difference of the forbidden band gap between the optical guiding layer and the active layer from becoming small. In this case, however, the thickness of the carrier confinement layer 10 is preferably below the oscillation wavelength in the active layer in order to sufficient permit leakage of the light from the active layer 3 to the optical guiding layer 11 so as to obtain sufficient effects. Generally, the thickness is selected from the range of 0.04 to 0.5 μm. It is more preferred the thickness is up to 0.3 μm in the aforementioned GaAlAs type semiconductor laser device, though the maximal thickness naturally depends upon the refractive index of each layer.

Incidentally, the effect of the present invention can be accomplished similarly when the protuberance is formed close to the optical output facet with a recess at the center of the substrate in the reverse manner to those of FIG. 2. In this case, the sequence of lamination of the semiconductor layers shown in FIGS. 4 and 5 must be reversed to optically couple the laser light generated in the active layer 3 to the third semiconductor layer (optical guiding layer) at the optical output facet portion.

EXAMPLE 1

An embodiment will be explained with reference to FIG. 2.

About 10 μm-wide, 2 μm-deep gutters 12, 12' are formed at both facets of the n-type GaAs substrate 1 as the light-emitting surfaces by a known etching process. Next, an n-type $Ga_{1-x}Al_xAs$ layer 2 ($0.2 \leq x \leq 0.6$; Sn dope; first clad layer), a $Ga_{1-y}Al_yAs$ layer 3 ($0 \leq y \leq 0.2$; undoped; active layer), a p-type $Ga_{1-w}Al_wAs$ layer 10 ($0.1 \leq W \leq 0.5$; Ge dope; blocking layer), a p-type $Ga_{1-}$ $_zAl_zAs$ layer 11 ($0.1 \leq z \leq 0.5$; Ge dope; optical guiding layer), a p-type $Ga_{1-x'}Al_{x'}As$ layer 4 ($0.2 \leq x' \leq 0.6$; Ge dope; second clad layer) and a p-type GaAs layer 5 (cap layer) are formed on the n-type GaAs substrate 1 by a known continuous liquid phase epitaxial process. The mole fraction of each layer is $y<x$, $y<z<w$ and $z<x'$.

Concrete examples of semiconductor laser devices thus fabricated are shown in Table 1.

TABLE 1

|   | $Ga_{1-x}Al_xAs$ | | $Ga_{1-y}Al_yAs$ | | $Ga_{1-w}Al_wAs$ | | $Ga_{1-z}Al_zAs$ | | $Ga_{1-x'}Al_{x'}As$ | |
|---|---|---|---|---|---|---|---|---|---|---|
|   | x | thickness | y | thickness | w | thickness | z | thickness | x' | thickness |
| 1 | 0.32 | 2.0$^{\mu m}$ | 0.05 | 0.05$^{\mu m}$ | 0.28 | 0.2$^{\mu m}$ | 0.20 | 1.0$^{\mu m}$ | 0.38 | 2.0$^{\mu m}$ |
| 2 | 0.32 | 2.0 | 0.05 | 0.10 | 0.28 | 0.2 | 0.15 | 1.0 | 0.38 | 2.0 |
| 3 | 0.32 | 2.0 | 0.05 | 0.05 | 0.32 | 0.2 | 0.15 | 1.0 | 0.38 | 2.0 |
| 4 | 0.32 | 2.0 | 0.05 | 0.10 | 0.32 | 0.2 | 0.10 | 1.0 | 0.38 | 2.0 |

Generally, the semiconductor layer 2 is 0 to 1.0 to 2.0 μm thick, semiconductor layer 3 (active layer) is 0.02 to 0.2 μm thick, semiconductor layer 4 is 0.04 to 0.5 μm thick and semiconductor layer 5 is 1.0 to 2.5 μm thick.

Thereafter, 3000 Å thick $SiO_2$ film is formed by a known CVD process, and a strip of opening is bored on this $SiO_2$ at the portion corresponding to the protuberance of the substrate 1 by ordinary photolithography extending along the propagating direction of the laser. The opening is 3 μm wide. Cr-Au as a p-side electrode 6 and AuGe-Ni as an n-side electrode 7 are vapor-deposited. The crystal facets facing each other as the light emitting surfaces are cleaved to form resonance reflecting surfaces that are parallel with each other. Thus, a semiconductor laser device, which is easy to fabricate and has high reliability, can be obtained. The conventional device whose facet is not rendered transparent has characteristic values of a threshold current of 60 mA, a differential quantum efficiency of 35%v and a pulse facet degradation intensity of 100 mW. In the device in accordance with the present invention (such as Sample No. 1), the pulse degradation intensity becomes 1 W at a threshold current of 65 mA and a differential quantum efficiency of 32%. In a 40 W continuous operation test at 70° C., almost all the devices in accordance with the present invention did not undergo catastrophic degradation for a periods of at least 10,000 hours whereas the average life of the conventional device is 1,000 hours.

Figure 1:
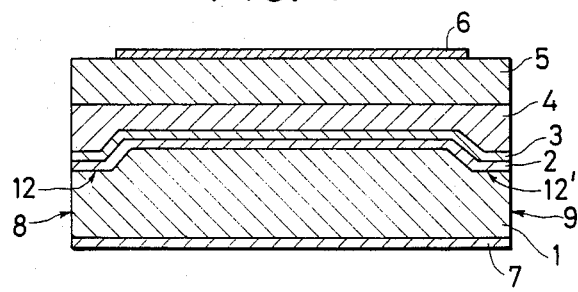
FIG. 1 is a sectional view of the idea of the semiconductor laser device for preventing the catastrophic degradation of facets taken in a plane parallel to the propagating direction of the laser light.

FIG. 11 comparatively shows the characteristics of the semiconductor laser device (Sample No. 1) of the present invention and those of the conventional semiconductor laser device having the structure shown in FIG. 1. The abscissa represents the applied current and the ordinate represents the optical output. It can be appreciated from FIG. 1 that the device of the present invention is extremely advantageous for realizing high output.

In the $Ga_{1-x}Al_xAs$ type laser devices, the present invention can naturally be applied to the whole of the direct transition region of the active layer. The invention can also be applied to laser devices fabricated from the III-V group compounds, such as the InP-InGaAsP system, GaAlAsP-GaAs semiconductors.

Both side surfaces of the semiconductor laminate region for causing laser oscillation may be buried by the buried layer.

In this case, a stripe-like mask having a 3 μm wide stripe is formed on the surface of the semiconductor layer 5 at the stage after completion of the continuous liquid epitaxial growth. The longitudinal direction of the stripe is parallel to the propagating direction of the laser light. The mask is formed by first applying a PSG film on the crystal surface and then removing the portions other than the stripe by a known etching process using a photoresist. Etching is carried out using an etching solution ($NH_4OH + H_2O + H_2O$ mixed solution) until the surface of the semiconductor substrate 10 is exposed. $Ga_{1-u}Al_uAs$ layers 14 are formed on the stripe portion to confine the light distribution, and u satisfies the relation $u > \mu$ in this case.

Thereafter, a 3000 Å thick $SiO_2$ film is formed by the CVD process. The region corresponding to the upper portion of the laminate structure of the abovementioned semiconductor layer is selectively removed to form a 3 μm wide strip by photo-lithography using an ordinary photoresist. Cr+Au as the p side electrode 6 and Au+AuGe−Ni as the N side electrode 7 are vapor-deposited. The end surfaces of the semiconductor laser device opposing each other are cleaved to form resonance reflecting surfaces that are parallel with each other.

The same effects as the aforementioned effects can be obtained.

EXAMPLE 2

Figure 7:
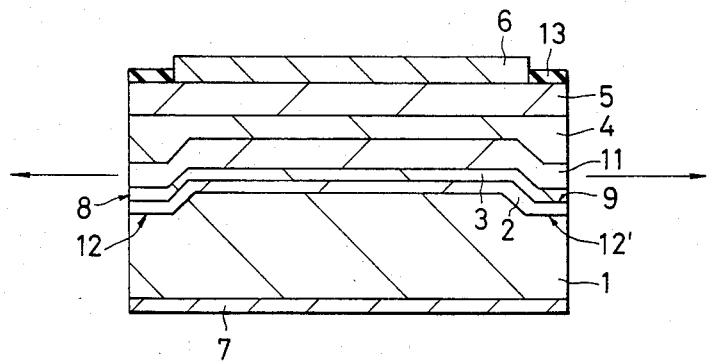

The explanation will be made with reference to FIG. 7.

Gutters 12, 12', each having a width of about 10 μm and a depth of 3 μm are formed on the two end surfaces of the p-type GaAs substrate 1 to serve as the light-emitting surfaces by a known etching process. Next, a p-type $Ga_{1-x}Al_xAs$ layer 2 (first clad layer), a $Ga_{1-y}Al_yAs$ layer 3 (undoped; active layer), an n-type $Ga_{1-z}Al_zAs$ layer 4 (second clad layer) and an n-type GaAs 5 (cap layer) are formed on the upper portion of the p-type GaAs substrate 1 by known liquid phase epitaxial growth. Each layer of the semiconductor laser devices thus fabricated is concretely shown in Table 2.

TABLE 2

|   | $Ga_{1-x}Al_xAs$ | | $Ga_{1-y}Al_yAs$ | | $Ga_{1-z}Al_zAs$ | | $Ga_{1-x'}Al_{x'}As$ | |
|---|---|---|---|---|---|---|---|---|
|   | x | thickness | y | thickness | z | thickness | x' | thickness |
| 1 | 0.38 | 2.0$^{\mu m}$ | 0.05 | 0.05$^{\mu m}$ | 0.28 | 0.6$^{\mu m}$ | 0.32 | 2.0$^{\mu m}$ |
| 2 | 0.38 | 2.0 | 0.05 | 0.10 | 0.24 | 0.6 | 0.32 | 2.0 |
| 3 | 0.38 | 2.0 | 0.05 | 0.15 | 0.22 | 0.6 | 0.32 | 2.0 |
| 4 | 0.38 | 2.0 | 0.05 | 0.05 | 0.26 | 1.0 | 0.32 | 2.0 |
| 5 | 0.38 | 2.0 | 0.05 | 0.10 | 0.23 | 1.0 | 0.32 | 2.0 |
| 6 | 0.38 | 2.0 | 0.05 | 0.15 | 0.21 | 1.0 | 0.32 | 2.0 |
| 7 | 0.38 | 2.0 | 0.05 | 0.05 | 0.23 | 1.5 | 0.32 | 2.0 |
| 8 | 0.38 | 2.0 | 0.05 | 0.08 | 0.22 | 1.5 | 0.32 | 2.0 |
| 9 | 0.38 | 2.0 | 0.05 | 0.10 | 0.21 | 1.5 | 0.32 | 2.0 |

Next, a 3,000 Å thick $SiO_2$ film 13 is formed by the known CVD process. A long thin opening extending in the propagating direction of the laser is formed at the portion corresponding to the upper surface of the protuberance region of the substrate 1 by ordinary photo-lithography. The opening is 3 μm wide.

Au-AuGe-Ni as the n side electrode 6 and Cr-Au as the p side electrode 7 are vapor-deposited. The opposed facets of the crystal 8, 9 as the light-emitting surfaces are cleaved to form resonance reflecting surfaces parallel with each other, completing fabrication of the semiconductor laser device.

In the same way as the abovementioned embodiment, this embodiment can prevent catastrophic degradation.

EXAMPLE 3

In this embodiment, the gutters are defined on the first semiconductor layer 2 disposed on the semiconductor substrate 1. The same effects as those of the aforementioned embodiments can also be accomplished by this structure.

Figure 8:
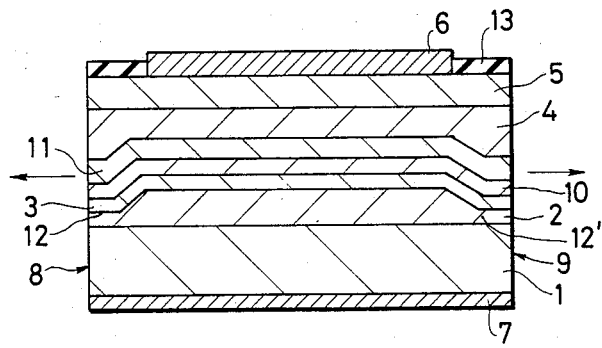

As shown in FIG. 8, an n-type $Ga_{1-x}Al_xAs$ (x=0.5) layer 2 is formed on an n-type GaAs substrate 1, and gutters 12, 12' each having a width of about 10 μm and a depth of ~4 μm are formed next to the optical output facets. Next, an undoped $Ga_{1-y}Al_yAs$ layer 3 (y=0.1), a p-type $Ga_{1-w}Al_wAs$ layer 10 (w=0.5), a p-type $Ga_{1-z}Al_zAs$ layer 11 (z=0.3), a p-type $Ga_{1-x'}Al_{x'}As$ layer 4 (x'-0.5') and a p-type GaAs layer 5 are formed on thicknesses of 2 μm, 0.1 μm, 0.2 μm, 1 μm, 2 μm and 0.5 μm, respectively, by the known liquid phase epitaxial growth.

Thereafter, a 3,000 Å thick $SiO_2$ film 13 is formed by the known CVD process and predetermined openings are formed on this $SiO_2$ film. Cr-Au as the p side electrode 6 and Au-Ge-Ni as the n side electrode 7 are vapor-deposited. The opposed facets 8, 9 of the crystal to serve as the light-emitting surfaces are cleaved to form resonance reflecting surfaces parallel with each other.

EXAMPLE 4

Figure 9:
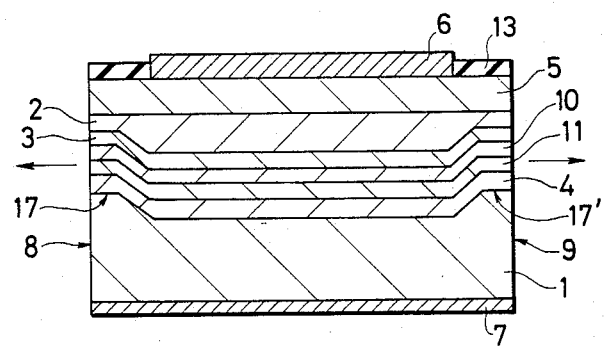
Figure 10:
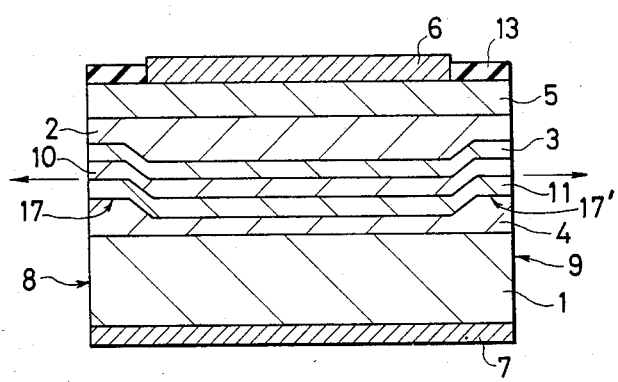

In this embodiment, a recess is defined at the center of the semiconductor substrate. FIG. 9 is a sectional view showing the embodiment in which the recess is formed directly on the semiconductor substrate 1 and FIG. 10 shows an embodiment in which the aforementioned fourth semiconductor layer is formed on the semiconductor substrate 1 and the recess is then formed on this fourth semiconductor layer. The protuberances 17, 17' of the light-emitting facets have a width of 5 to 10 μm and a height of about 2 to 4 μm. The semiconductor substrate 1 consists of n-type GaAs and the fourth semiconductor layer 4 consists of an n-type $Ga_{1-x'}Al_{x'}As$ layer (x'=0.5). Its thickness is 2 μm in FIG. 9 and ~5 μm in FIG. 10.

An n-type $Ga_{1-z}Al_zAs$ layer 11 (z=0.3; optical guiding layer), an n-type $Ga_{1-w}Al_wAs$ layer 10 (w=0.5; blocking layer), an undope $Ga_{1-y}Al_yAs$ layer 3 (y=0.1; active layer), a p-type $Ga_{1-x}Al_xAs$ layer 2 (x=0.5; second clad layer) and a p-type GaAs layer 5 (cap layer) are formed further thereon. The thicknesses of these layers are 1 μm, 0.1 μm, 2 μm and 0.5 μm, respectively.

Thereafter, the $SiO_2$ insulating film 13, the p side electrode 6 and the n side electrode 7 are formed in the same way as in the aforementioned embodiment and the crystal facets to serve as the light-emitting surfaces are cleaved to form resonance reflecting surfaces.

This embodiment can prevent the catastrophic degradation while minimizing the optical losses in the same way as in the aforementioned embodiments.

What is claimed is:

1. A semiconductor laser device including at least a laminated layer region of first, second, third and fourth semiconductor layers on a predetermined semiconductor substrate, means forming a resonant cavity, and electrodes for injecting current into said device, wherein said second layer is an active layer; said third semiconductor layer has a refractive index smaller than that of said second semiconductor layer; said first and fourth semiconductor layers having a refractive index smaller that that of said second and third semiconductor layers; said first semiconductor layer has a conductivity type opposite that of said third and fourth semiconductor layers; the forbidden band gap of said first and third semiconductor layers is greater than that of said second semiconductor layer; and at least said second and third semiconductor layers are bent along lines parallel to and inwardly spaced from the laser light-emitting facets of said device, to such a degree that the laser light generated inside said second semiconductor layer, in the proximity of said laser light-emitting facets, is optically coupled to said third semiconductor layer and is emitted from the crystal facets of said third semiconductor layer, at least one of said electrodes having a width less than the width of said laminated layer regions such as to overlie substantially only that portion of said layer region between said lines where said second and third layers are bent.

2. The semiconductor laser device defined in claim 1 wherein a fifth semiconductor layer, having the same conductivity type as said third semiconductor layer, is formed between said second and third semiconductor layers and the forbidden band gap of said fifth semiconductor layer is greater than that of said second and third semiconductor layers.

3. The semiconductor laser device defined in claim 2 wherein said fifth semiconductor layer is no thicker than the oscillation wavelength of the laser light inside an active layer.

4. The semiconductor laser device defined in claim 1 wherein said first semiconductor layer is formed on said semiconductor substrate; recesses are located on the upper surface of said first semiconductor layer in the proximity of the light-emitting facets; at least said second, third and fourth semiconductor layers are disposed as sequential laminations on said first semiconductor layer; and at least said first, second and third semiconductor layers are bent in the direction of said semiconductor substrate in a manner which corresponds to said recesses.

5. The semiconductor laser device defined in claim 2 wherein said first semiconductor layer is formed on said semiconductor substrate; recesses are located on the upper surface of said first semiconductor layer in the proximity of the light-emitting facets; at least said second, fifth, third and fourth semiconductor layers are disposed as sequential laminations on said first semiconductor layer; and at least said first, second, fifth and third semiconductor layers are bent in the direction of said semiconductor substrate in a manner corresponding to said recesses.

6. The semiconductor laser device defined in claim 1 wherein said fourth semiconductor layer is formed on said semiconductor substrate; protuberances are contained on the upper surface of said fourth semiconductor layer in the proximity of the light-emitting facets; at least said third, second and first semiconductor layers are disposed as sequential laminations on said fourth semiconductor layer; and at least said said fourth, third and second semiconductor layers are bent in the direction of the laminate layer with respect to said semiconductor substrate in such a manner as to correspond to said protuberances.

7. The semiconductor laser device defined in claim 2 wherein said fourth semiconductor layer is formed on said semiconductor substrate; protuberances are contained on the upper surface of said fourth semiconductor layer in the proximity of the light-emitting facets; and at least said third, fifth and second semiconductor layers are bent in the direction of the laminate layer with respect to said semiconductor substrate in a manner corresponding to said protuberances.

* * * * *